(12) United States Patent
Horng

(10) Patent No.: US 7,119,286 B1
(45) Date of Patent: Oct. 10, 2006

(54) ELECTROMAGNETIC INTERFERENCE SHIELDING STRUCTURE

(76) Inventor: Chin-Fu Horng, 4F, No. 282, Chung Shan I Rd., Lu Chou City, Taipei Hsien (TW)

(*) Notice: Subject to any disclaimer, the term of this patent is extended or adjusted under 35 U.S.C. 154(b) by 0 days.

(21) Appl. No.: 11/324,326

(22) Filed: Jan. 4, 2006

(30) Foreign Application Priority Data

Dec. 16, 2005 (TW) .............................. 94222052 U

(51) Int. Cl.
*H05K 9/00* (2006.01)
(52) U.S. Cl. .................. 174/379; 174/377; 174/383; 174/384; 361/816
(58) Field of Classification Search .............. 174/350, 174/377, 378, 379, 382, 383, 384, 385, 386, 174/394; 361/800, 816, 818
See application file for complete search history.

(56) References Cited

U.S. PATENT DOCUMENTS

| | | | | |
|---|---|---|---|---|
| 5,614,694 A | * | 3/1997 | Gorenz et al. .............. 174/375 |
| 6,136,131 A | * | 10/2000 | Sosnowski .................. 174/383 |
| 6,178,097 B1 | * | 1/2001 | Hauk, Jr. ..................... 174/382 |
| 6,384,324 B1 | * | 5/2002 | Flegeo ........................ 174/390 |
| 6,552,261 B1 | * | 4/2003 | Shlahtichman et al. ..... 174/384 |
| 6,711,032 B1 | * | 3/2004 | Sommer ...................... 361/816 |
| 6,897,371 B1 | * | 5/2005 | Kurz et al. .................. 174/382 |
| 6,903,262 B1 | * | 6/2005 | Blersch ....................... 174/385 |

* cited by examiner

*Primary Examiner*—Dean A. Reichard
*Assistant Examiner*—Adolfo Nino
(74) *Attorney, Agent, or Firm*—Rosenberg, Klein & Lee

(57) ABSTRACT

An electromagnetic interference shielding structure includes a shielding housing to enclose an electronic component and reduce electromagnetic interference. Two tearable line-grooves are separately formed at a top surface of the shielding housing, and two long slots and two recesses are formed at two rounded portions of two sides of the shielding housing. A cover plate is movably formed between the two tearable line-grooves and the two long slots. The cover plate is removable from the shielding housing during maintenance, and a cover lid is used to restore the shielding housing. The cover lid has a top surface being as high as the top surface of the shielding housing. There is no height difference to meet the requirement of modern communication product about slim and light-weighted.

7 Claims, 6 Drawing Sheets

ELECTROMAGNETIC INTERFERENCE SHIELDING STRUCTURE

BACKGROUND OF THE INVENTION

1. Field of the Invention

The present invention relates to an electromagnetic interference shielding structure, and in particular to a shielding structure that is used to enclose electrical components and reduce the electromagnetic interference.

2. Description of Related Art

To reduce electromagnetic interference (EMI) on performance of circuit chips and central processing unit, a shielding housing 7 that is used to reduce EMI as shown in FIG. 1 and has a main body 71 having a receiving space to receive an electronic component 8. A tearable line-groove 72 is positioned at the top surface of the main body 71 and in the vicinity of periphery of the main body 71 so that a cover plate 73 is removably positioned at the main body 71. The shielding housing 7 is used to cover the electronic components 8 positioned at a circuit board 9 and to reduce electromagnetic interference.

When the electronic component 8 need maintenance, a sharp tool (such as screw driver) is used to insert into a pre-defined hole (not shown) so that the cover plate 73 is removed along the tearable line-groove 72 and a big hole is formed at the top of the main body 71. It is easy to do maintenance on the electronic component 8. After the maintenance, a new cover plate (not shown) is used to cover the shielding housing 7.

As described above, the shielding housing 7 is able to efficiently protect the electronic components from electromagnetic waves, and cost of the shielding housing 7 is low. However, design of the shielding housing 7 is not perfect and needs improvement. That is, the cover plate 73 is slightly higher than the top surface of the shielding housing 71 so that a height difference between the shielding housing 71 and the cover plate 73 is formed (the height difference is about 0.15 mm) and the receiving space for the electronic components is limited. In addition, after the cover plate 73 is removed, a new cover plate (not shown) is used to cover so that the height difference is larger (because of a new cover plate). All communication products should be slim and light-weighted so there is a limitation to the design of the communication product.

Thus, there is a need for an electromagnetic interference shielding structure.

SUMMARY OF THE INVENTION

It is an object of the present invention to an electromagnetic interference shielding structure that has no height difference and good space efficiency. Even a new cover lid is placed, there is no height difference between the new cover lid and a top surface of the shielding structure to meet the requirement of modern communication product about slim and light-weighted.

To achieve object of the present invention, an electromagnetic interference shielding structure has a shielding housing. The shielding housing has two tearable line-grooves that are separately formed at a top surface thereof. Two long slots and two recesses are formed at two side edges of the top surface of the shielding housing. Each of the long slots has two ends that are respectively connected with each two ends of the tearable line-grooves. A cover plate is movably formed between the two tearable line-grooves and the two long slots so that the top surface of the cover plate is as high as the top surface of the shielding housing.

BRIEF DESCRIPTION OF THE DRAWINGS

The present invention can be fully understood from the following detailed description and preferred embodiment with reference to the accompanying drawings, in which.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
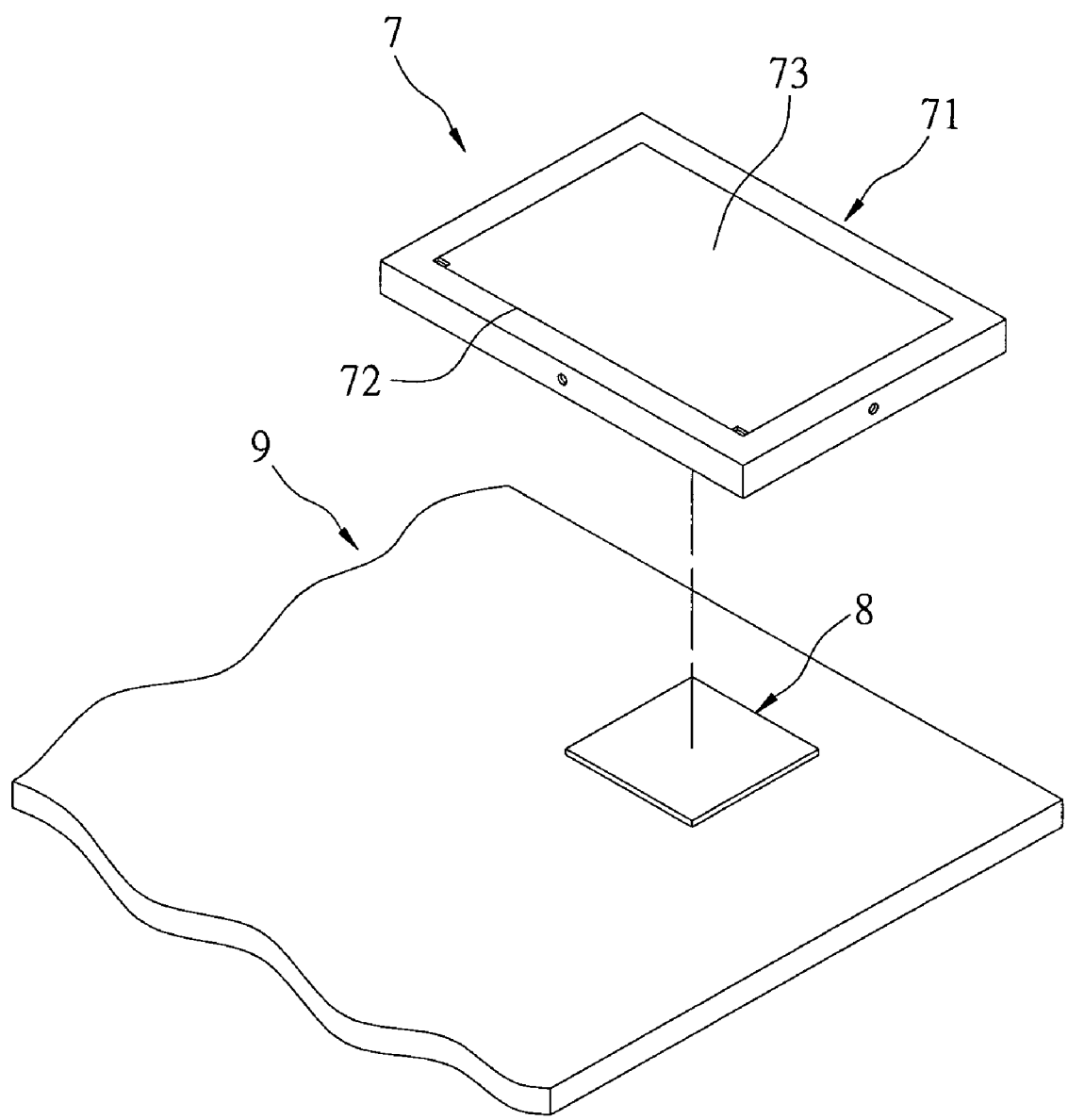
FIG. 1 is a perspective view of an electromagnetic interference shielding structure according to a related art.
Figure 2:
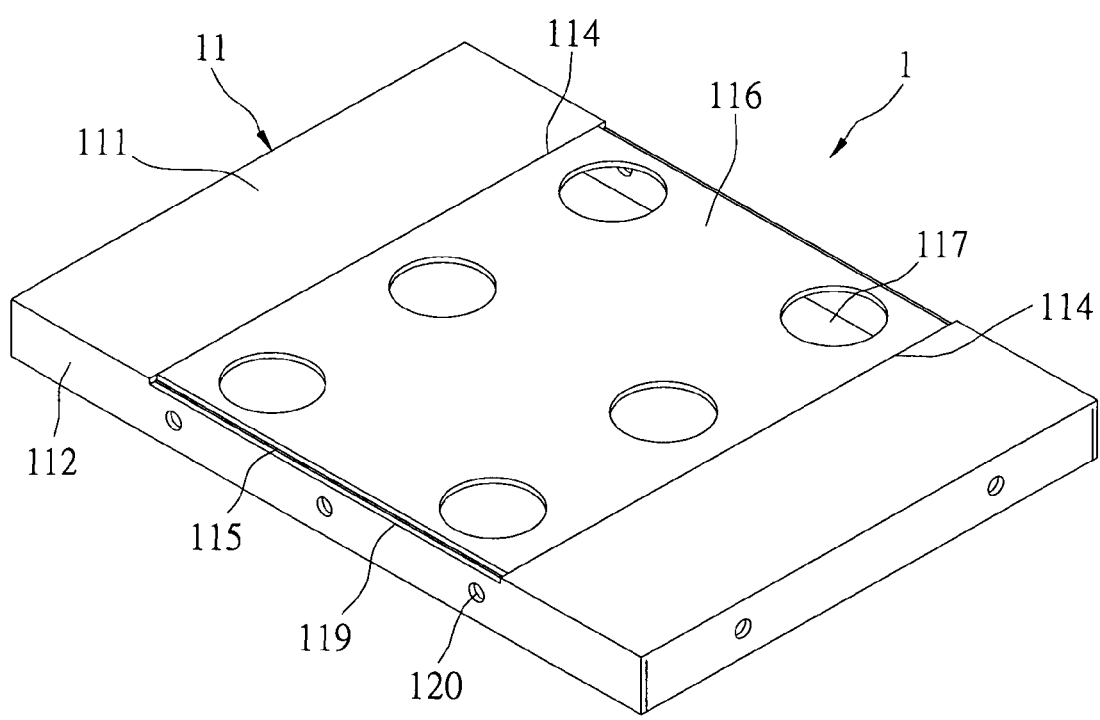
FIG. 2 is a perspective view of an electromagnetic interference shielding structure according to the present invention.
Figure 3:
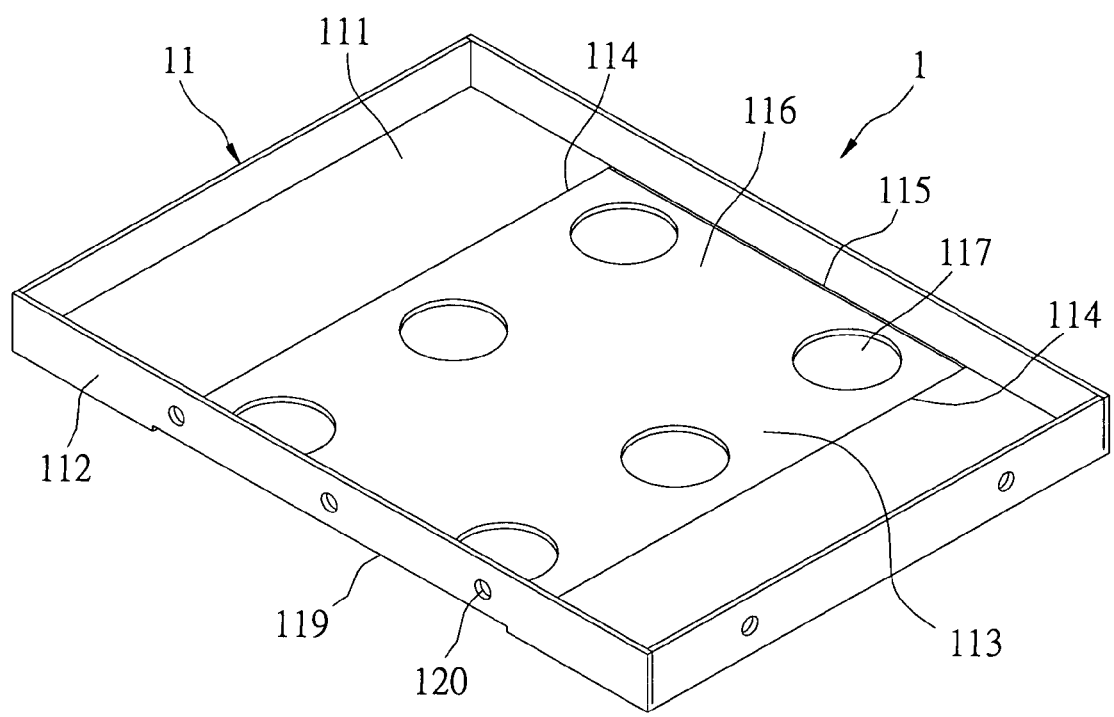
FIG. 3 is another perspective view of an electromagnetic interference shielding structure according to the present invention.

Reference is made to FIGS. 2 and 3. FIGS. 2 and 3 illustrate an electromagnetic interference shielding structure of the present invention. The electromagnetic interference shielding structure is removable and made of metallic. The shielding structure 1 includes a shielding housing 11 used to cover an electronic component, and the shielding housing 11 is hollow and can be in a square shape or other shape. The shape of the shielding housing 11 is not limited to these and depends on the shape of the electronic component.

The shielding housing 11 is metallic and manufactured by punching process, and the shielding housing 11 includes a top plate 111 and a plurality of side plates 112 respectively extending and bending from the top plate 111. A receiving space 113 is formed between the top plate 111 and the side plates 112. The receiving space 113 is formed in the shielding housing 11 to receive the electronic component. Thus, the electronic component are covered by the shielding housing 11.

Two tearable line-grooves 114 are separately formed at the top surface of the shielding housing 11 and are breakable. The two tearable line-grooves 114 are positioned at the top plate 111 of the shielding housing 11 in parallel. A distance between the two tearable line-grooves 114 is not pre-defined value and depends on design of the shielding housing 11.

Two long slots 115 are respectively formed at two rounded portions of the shielding housing 11 and are manufactured by punching process. The two long slots 115 penetrate through the top surface and the bottom surface of the top plate 111. Each two ends of the two long slots 115 are respectively connected with each two ends of the tearable line-grooves 114 so that a cover plate 116 is movably formed between the tearable line-grooves 114 and the two long slots 115. The cover plate 116 is as high as the top plate 111 of the shielding housing 11 so there is no height difference at the top surface of the shielding structure 1.

Figure 5:
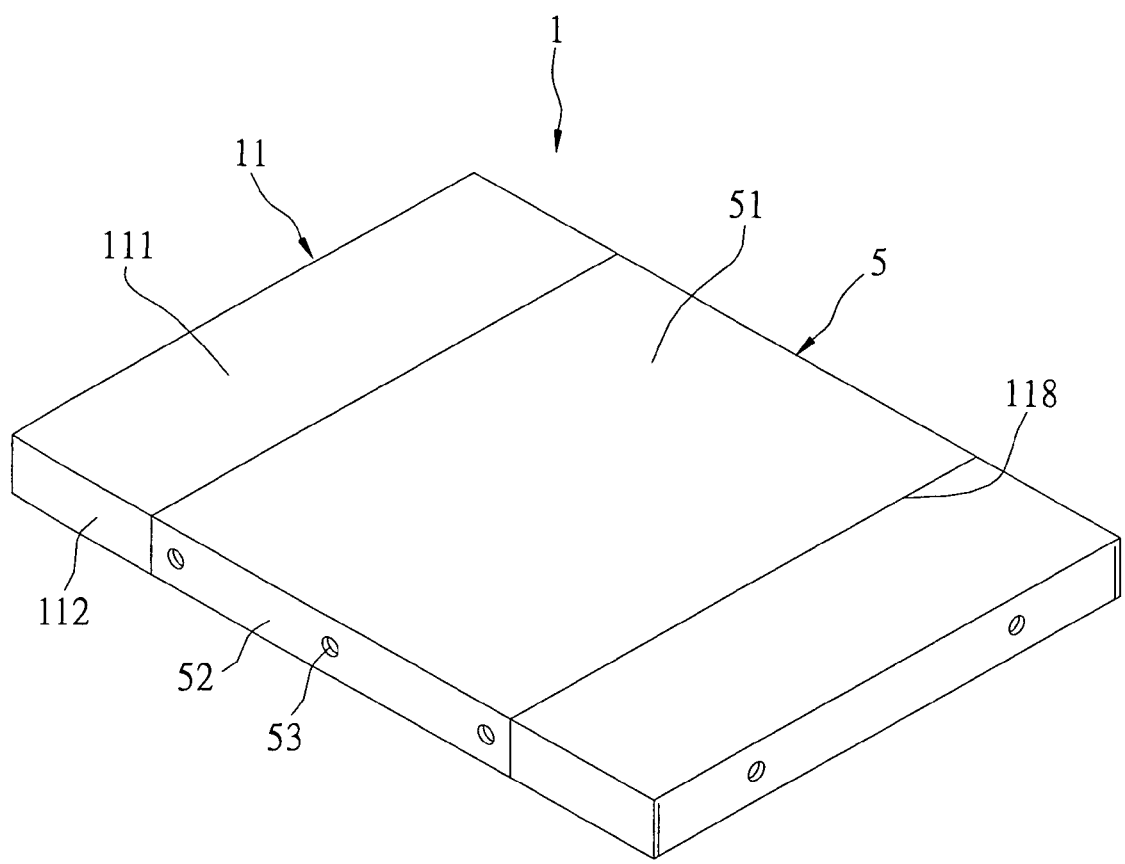
FIG. 5 is a perspective view of an electromagnetic interference shielding structure with a cover lid according to the present invention.
Figure 6:
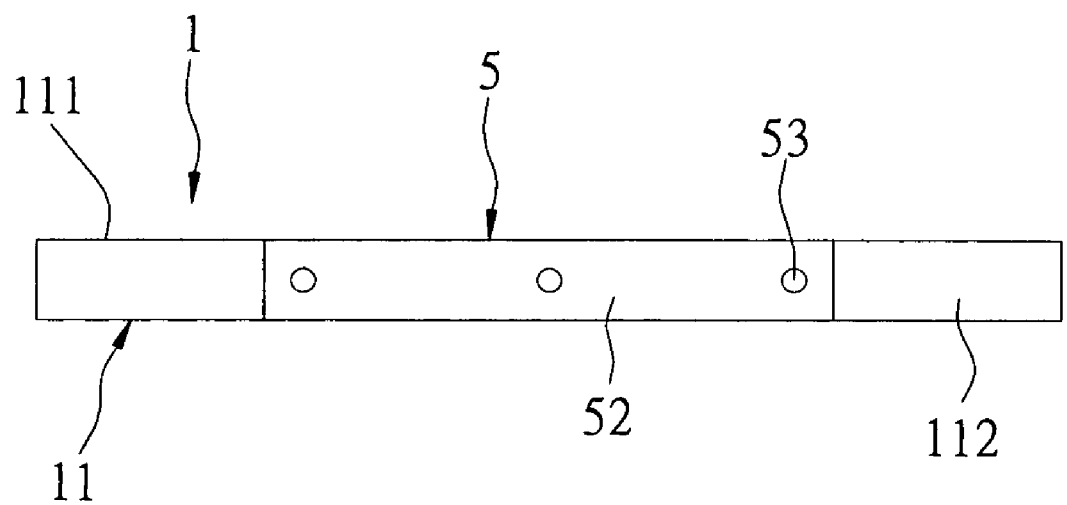
FIG. 6 is a side view of an electromagnetic interference shielding structure with a cover lid according to the present invention.

Two recesses 119 are respectively formed at two rounded portions of the shielding housing 11 by punching process and are respectively communicating with the two long slots 115. The two recesses 119 are formed at upper edge of the side plates 112 and have a depth that is equal to or larger than a thickness of a cover lid 5 as shown in FIGS. 5 and 6.

The two sides (the side plates 112) of the shielding housing 11 have a plurality of orientating holes 120 for orientating the cover lid 5. The cover plate 116 of the shielding housing 11 has a plurality of openings 117 which are used to draw heat away from the electronic component covered by the shielding housing 11. A sharp tool is used to insert to the openings 117 and open the cover plate 116 which is removably formed at the top surface of the shielding housing 11.

According to the present invention, the shielding structure 1 is used to cover an electronic component positioned at a circuit board. The shielding structure 1 is also fixed to the circuit board by soldering process to prevent the electronic component from electromagnetic interference.

Figure 4:
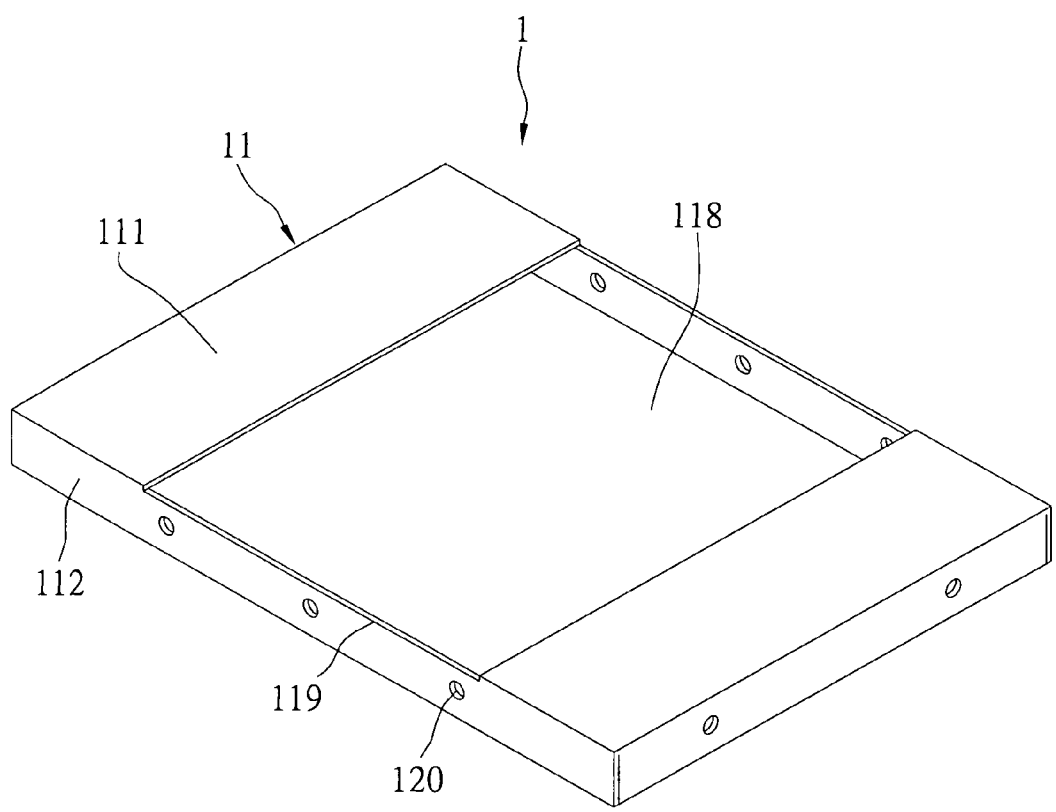
FIG. 4 is a perspective view of an electromagnetic interference shielding structure with a cover plate removed according to the present invention.

When the electronic component need maintenance, a sharp tool (such as screw driver) is inserted to the openings 117 to open the cover plate 116, and the cover plate 116 is lift along the tearable line-grooves 114 so that a central opening 118 is formed on the top of the shielding housing 11 (as shown in FIG. 4). Thus, it is convenient for technician to do maintenance.

After the maintenance, the cover lid 5 can be placed on the top surface of the shielding structure 1 as shown in FIGS. 5 and 6. The cover lid 5 is metallic and manufactured by punching process. In addition, the cover lid 5 is a reversed U-shaped piece and includes a top wall 51 and two side walls 52 extending and bending from the top board 51. The cover lid 5 has a width that is substantially equal to that of the central opening 118 so that the cover lid 5 is adapted to cover the central opening 118 of the shielding structure 1. The central opening 118 is used to receive the top wall 51 of the cover lid 5, and the two side walls 52 of the cover lid 5 are respectively positioned to cover two sides (the side plates 112) of the shielding housing 11. A plurality of orientating dimples 53 are formed on the two side walls 52 of the cover lid 5 and correspond with the orientating holes 120 of the side plate 112 of the shielding housing 11. Therefore, the cover lid 5 is firmly positioned at the shielding housing 11 to cover the central opening 118.

According to the present invention, the shielding housing 11 includes the two tearable line-grooves 114, the two long slots 115 and the two recesses 119 so that there is no height difference between the cover plate 116 and the shielding housing 11. A height difference is formed between two rounded portions and the top surface of the shielding housing 11 during the maintenance and is equal to the thickness of the cover lid 5. When the cover lid 5 is restored, no height difference is formed between the shielding housing 11 and the cover lid 5.

While the invention has been described with reference to the preferred embodiments, the description is not intended to be construed in a limiting sense. It is therefore contemplated that the appended claims will cover any such modifications or embodiments as may fall within the scope of the invention defined by the following claims and their equivalents.

What is claimed is:

1. An electromagnetic interference shielding structure, comprising:
   a shielding housing having
      two tearable line-grooves separately formed at a top surface thereof,
      two long slots formed at two side edges of the top surface of the shielding housing, each of the long slots having two ends respectively connected with each two ends of the tearable line-grooves;
      two recesses formed at two sides of the shielding housing and respectively communicated with the two long slots; and
   a cover plate movably formed between the two tearable line-grooves and the two long slots, whereby the top surface of the cover plate is as high as the top surface of the shielding housing.

2. The electromagnetic interference shielding structure as claimed in claim 1, wherein the shielding housing is a metallic piece.

3. The electromagnetic interference shielding structure as claimed in claim 1, wherein the shielding housing includes a top plate and a plurality of side plates respectively extending and bending from the top plate, and a receiving space is defined between the top plate and the side plates, and the two tearable line-grooves are formed at the top plate of the shielding housing in parallel, and the two recesses are respectively formed at two opposite top edges of the side plates and respectively communicating with the two long slots.

4. The electromagnetic interference shielding structure as claimed in claim 1, wherein the cover plate has at least one opening formed thereon.

5. The electromagnetic interference shielding structure as claimed in claim 1, wherein a central opening is formed on the top of the shielding housing after the cover plate is moved, and a cover lid covers the central opening, the cover lid includes a top wall and two side walls respectively extending and bending from the top wall, and the top wall of the cover lid covers the central opening, and the two side walls of the cover lid respectively cover two sides of the shielding housing.

6. The electromagnetic interference shielding structure as claimed in claim 5, wherein a plurality of orientating holes are formed at the side plates of the shielding housing, and a plurality of orientating dimples are formed on the two side walls of the cover lid corresponding to the orientating holes.

7. The electromagnetic interference shielding structure as claimed in claim 5, wherein the cover lid is a metallic piece.

* * * * *